United States Patent [19]

Bertsch

[11] Patent Number: 4,707,667
[45] Date of Patent: Nov. 17, 1987

[54] OFFSET CORRECTED AMPLIFIER
[75] Inventor: John E. Bertsch, Essex Junction, Vt.
[73] Assignee: International Business Machines Corporation, Armonk, N.Y.
[21] Appl. No.: 857,651
[22] Filed: Apr. 30, 1986
[51] Int. Cl.$^4$ ............................................. H03F 1/26
[52] U.S. Cl. ........................................ 330/9; 330/84; 330/253; 330/295
[58] Field of Search ............ 330/9, 51, 69, 84, 124 R, 330/253, 295; 307/353, 359; 328/151

[56] References Cited

U.S. PATENT DOCUMENTS

| | | | |
|---|---|---|---|
| 3,936,759 | 2/1976 | Macheel | 328/162 |
| 3,988,689 | 10/1976 | Ochi et al. | 330/9 |
| 4,190,805 | 2/1980 | Bingham | 330/9 |
| 4,209,717 | 6/1980 | Mahony | 307/353 |
| 4,229,703 | 10/1980 | Bustin | 328/162 |
| 4,374,362 | 2/1983 | Sutherland et al. | 328/162 |
| 4,429,281 | 1/1984 | Ito et al. | 330/9 |
| 4,539,551 | 9/1985 | Fujita et al. | 330/9 X |

Primary Examiner—James B. Mullins
Attorney, Agent, or Firm—Francis J. Thornton

[57] ABSTRACT

An amplifier circuit having offset voltage and offset voltage drift corrections which does not require resistive feedback and is suitable for use with unmatched high frequency field effect transistor circuits. The described circuit cancels the offset voltage of a signal amplifier and comprises means for applying differential voltages to an operational amplifier, together with a switchable feedback connecting the output of the amplifier to one of its inputs and a capacitor coupled between the feedback input of the amplifier, and one of the differential voltages. This allows amplifying of low level AC signals while reducing the error introduced by the offset voltage or the offset voltage drift of the amplifier.

10 Claims, 6 Drawing Figures

OFFSET CORRECTED AMPLIFIER

BACKGROUND OF THE INVENTION

1. Field Of The Invention

This invention relates generally to amplifier circuits and more particularly to an amplifier circuit having both offset voltage correction and offset voltage drift correction.

2. Prior Art

Offset voltage amplifiers are known and have been used. In particular such amplifiers have used techniques which correct for offset voltage of a differential amplifier. Such techniques are varied in that some require a circuit coupled to the amplifier for sensing and storing of the offset voltage during a selected time period and supplying it to the amplifier input so that it is in opposition to the offset voltage during a second time period when the amplifier is connected to the signal source thus cancelling the offset voltage.

One technique is shown in U.S. Pat. No. 3,988,689. This patent teaches a circuit for cancelling the offset voltage of a signal amplifier using first and second amplifiers together with a third amplifier coupled to the outputs of the first and second amplifiers. The feedback from the third amplifier to the inputs of the first and second amplifiers is such that offset voltages are stored in a capacitor connected between the inputs of the second amplifier. When offset voltages are so stored on the capacitor, switches are opened to permit signal amplification through the signal amplifier to cancel the offset voltages.

A different technique is shown in U.S. Pat. No. 4,429,281 which describes an integrated circuit in which the outputs of the operational amplifier are coupled back, through a capacitor, to the input of the device in order to prevent potentials at the input and the output from varying and to ensure rapid stabilization of the integral operation.

Still another is shown in U.S. Pat. No. 4,229,703 which teaches the use of a zero reference in an offset compensation circuit where the output amplifier has a feedback loop comprising a resistive capacitive combination.

Finally, U.S. Pat. No. 4,190,805 teaches a commutating auto zero amplifier having a resistive feedback loop which can be coupled directly to either the negative input of the amplifier or capacitively to the positive input of the amplifier.

The above described techniques do not, especially with new, faster, higher frequency FET circuits, provide offset voltage correction and offset voltage drift correction. Especially they do not provide such corrections with low offset error nor do they operate without large complex matched transistor circuitry.

SUMMARY OF THE INVENTION

It can be therefore appreciated that the need exists for an amplifier circuit having offset voltage corrections which does not require resistive feedback and is suitable for use with unmatched high frequency field effect transistor circuits.

Accordingly, it is a primary object of the present invention to provide an offset voltage and offset voltage drift correcting amplifier circuit. Another object of the present invention is to provide such an offset voltage correcting amplifier circuit in which the offset voltage error of each amplifier in the circuit is automatically compensated for and corrected.

Still further, an object of the present invention is to provide a communicating offset memorization circuit which allows the amplification of low level AC signals while reducing the error introduced by the offset voltage and the offset voltage drift of an amplifier. This allows commutation of a DC signal through two parallel amplifiers to provide means of automatically compensating the offset voltage error of each.

These and other objects of the present invention are realized in the present invention by a circuit for cancelling the offset voltage of a signal amplifier which circuit comprises first and second input voltage means for applying a differential voltage to an operational amplifier, together with switchable feedback means connecting the output of the amplifier to one of its inputs and a capacitor coupled between the input of the amplifier, coupled to the feedback means, and to one of the input voltage means. This circuit has a continuous signal path which allows amplifying low level AC signals while reducing the error introduced by the offset voltage or the offset voltage drift of the amplifier.

An additional feature of the present invention is that a circuit of the present invention can be used in applications which require amplifiers that have both low offset voltages and low offset voltage drifts at levels which can not be achieved simply by matching the transistors in the differential input stage.

Still another feature of the present invention is that all of the components of the present invention can be integrated in a semiconductor chip.

By eliminating resistive feedback as used in the prior art all resistive-capacitive (R-C) time constants are eliminated in the present invention. This allows rapid charging of the offset memorization capacitor and permits much higher commutating frequencies to be achieved, smaller offset memorization capacitors to be used and simpler techniques for filtering switching noise following the amplifier. The offset memorization capacitor is switched in a manner to bypass the non-inverting input of the amplifier, improving the amplifier stability by preventing positive feedback caused by voltage spiking across the switches during capacitor charging.

The present invention, as well as other of its objects, features and advantages will be more fairly realized and understood from the following detailed description when taken in conjunction with the accompanying drawings wherein;

DETAILED DESCRIPTION OF THE PREFERRED EMBODIMENT

Figure 1A:
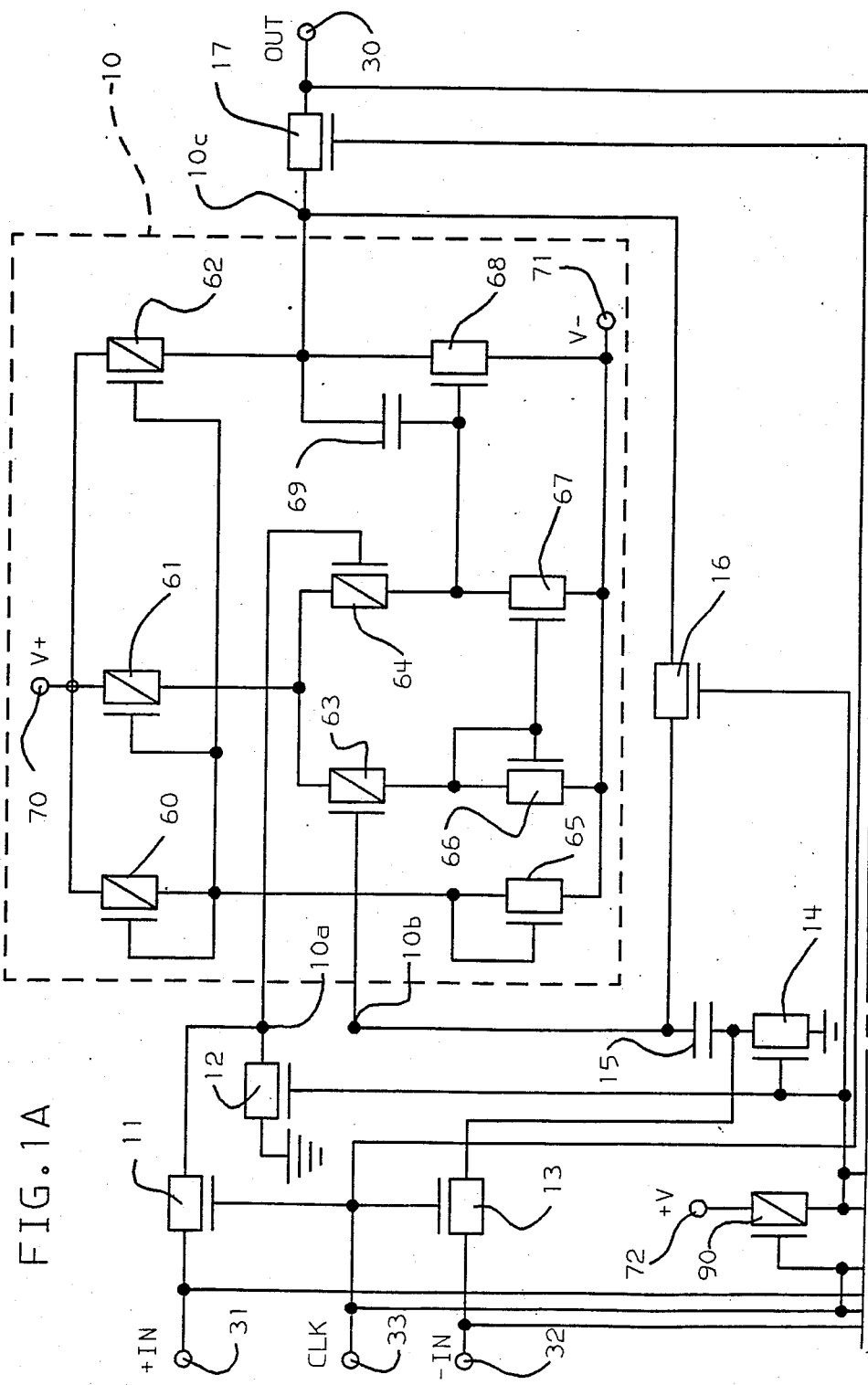
FIGS. 1a and 1b is a schematic diagram illustrating the functional elements of an offset corrected amplifier circuit constructed in accordance with the principles of the present invention.
Figure 1B:
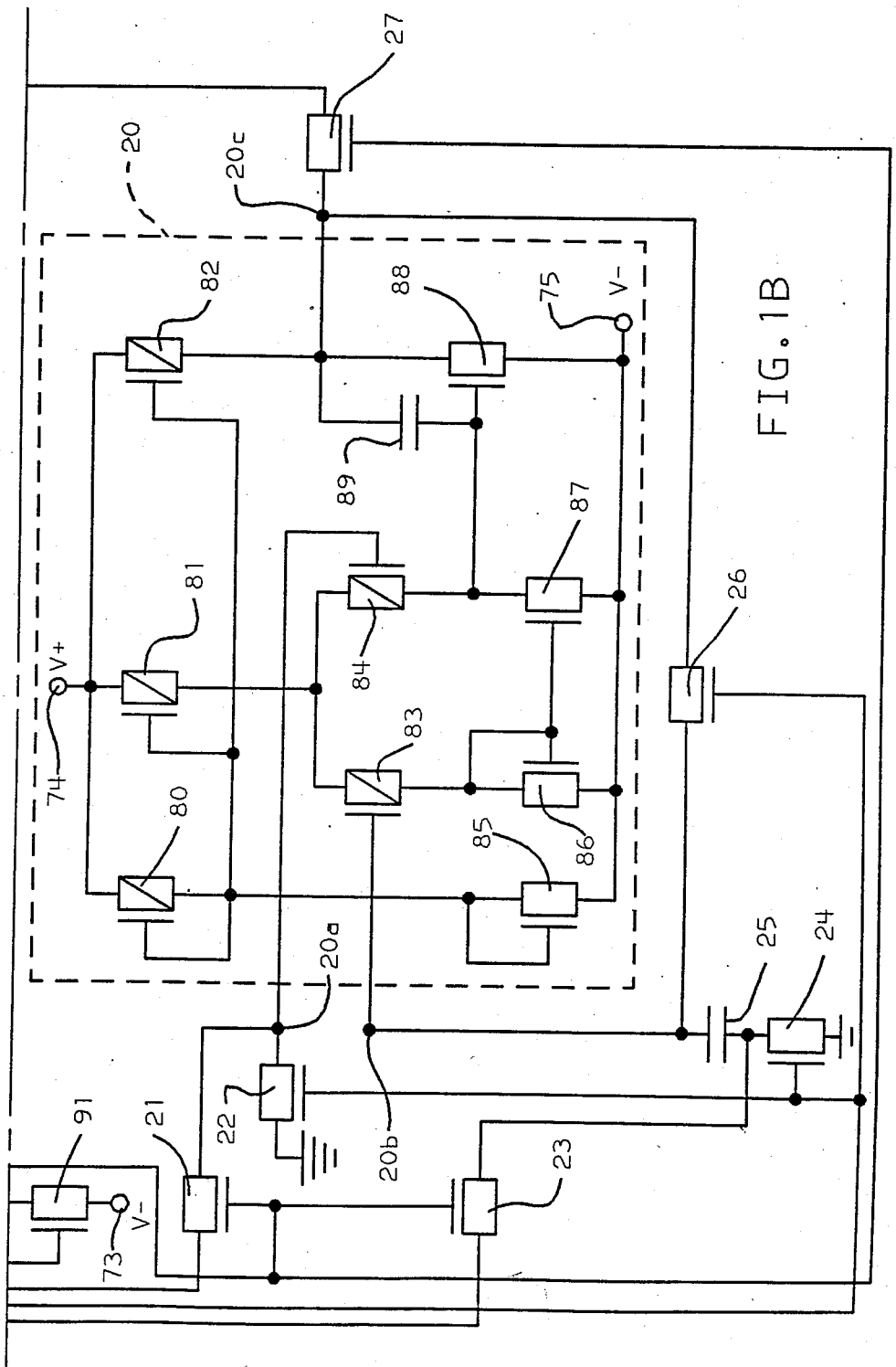

In FIGS. 1a and 1b, there is shown, in detail, a circuit embodying the present invention in which there is a pair of operational amplifiers 10 and 20, each of which produces an output voltage that is proportional to the voltage supplied at its inputs. The outputs 10c and 20c of amplifiers 10 and 20 respectively are coupled through respective output transistors 17 and 27 to a voltage output node 30.

The positive or non-inverting input 10a of amplifier 10 is coupled to an input voltage node 31 through the source drain electrodes of a field effect transistor 11 and to ground through the source drain electrodes of a field effect transistor 12. The negative or inverting input 10b of the operational amplifier 10 is coupled through a capacitor 15 and the source drain electrodes of a field effect transistor 14 to ground and through the source-drain electrode of still another field effect transistor 13 to a second input voltage node 32. The negative input 10b of the operational amplifier 10 is also coupled, through a feedback transistor 16, to its own output 10c.

The control electrodes of transistors 11, 13, and 17 are coupled in common and to a clock node 33 while the control electrodes of field effect transistors 12, 14, and 16 are coupled in common and to the output of an invertor circuit comprising transistors 90 and 91 coupled between voltage sources 72 and 73. The gates of transistors 90 and 91 are coupled to node 33.

The second operational amplifier 20 is similarly arranged in that its positive or non-inverting input 20a is coupled through a field effect transistor 21 to the first input voltage node 31 and to ground through another field effect transistor 22. Similarly, the negative or inverting input 20b of amplifier 20 is coupled through a capacitor 25 and a field effect transistor 24 to ground and through a field effect transistor 23 to the second input voltage node 32. The negative input node 20b of the operational amplifier 20 is also coupled through a feedback transistor 26 to its output 20c.

The control electrodes of transistors 21, 23, and 27 are all coupled to the output of invertor transistors 90 and 91 while the control electrodes of transistors 22, 24, and 26 are all coupled to clock 33.

The transistors of FIG. 1 are grouped into two sets with all transistors of each group ganged together for simultaneously conduction or non-conduction. The first group, consists of transistors 11, 13, 17, 22, 24 and 26 and the second group consists of transistors 12, 14, 16, 21, 23 and 27. While one group is conducting, the other group is non-conducting, and vice versa. The rate at which this occurs is termed the commutating frequency and determines the rate at which each amplifier is switched between an offset memorization mode and a signal processing mode, and vice versa. Offset memorization mode consists of the mode in which a capacitor is charged to the offset voltage of the amplifier. Signal processing mode consists of the mode in which the capacitor is placed in series with the input signal to cancel the offset voltage of the amplifier.

Positive and negative voltages, i.e. alternating, differential voltages, V1 and V2 are simultaneously applied to nodes 31 and 32, and the sources of transistors 11, 13, 21, and 23 all go to the respective voltage level of the node to which they are coupled. Similarly, the phase control node 33 has a clock signal applied thereto.

Figure 2A:
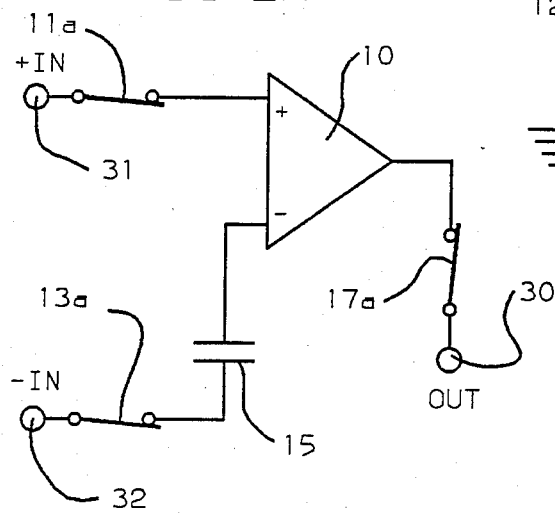
FIGS. 2a and 2b are circuit diagrams illustrating the first and second amplifiers of FIGS. 1a and 1b in the first condition of operation.
Figure 2B:
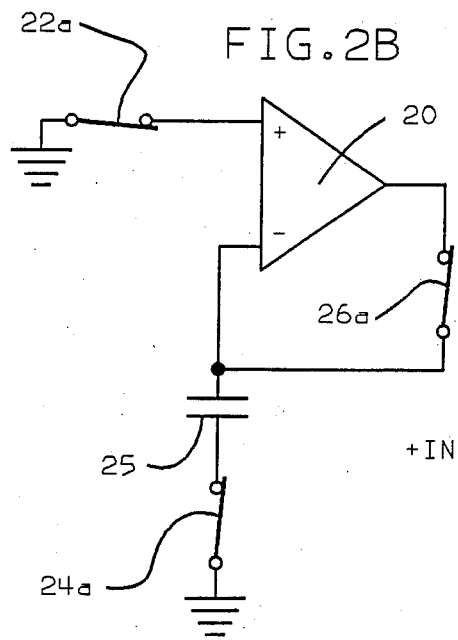

Operation of the circuit of FIGS. 1a and 1b is accomplished by causing the conduction of the transistors of groups 1 and 2 to alternate at the commutating frequency with all the transistors of group 1 being conductive when all transistors of group 2 are non-conductive, and vice versa. This operation is further illustrated in FIGS. 2a, 2b, 3a and 3b showing only the circuits schematically during alternate operation of the groups of transistors which are represented in these figs. by switches. Referring to FIG. 2a, amplifier 10 is connected in the signal processing mode wherein the closure of switches 11a, 13a and 17a connects the non-inverting input terminal 31 to the non-inverting input of amplifier 10, the inverting input terminal 32 through capacitor 15 to the inverting input of amplifier 10, and the output of amplifier 10 to the output terminal 30. At the same time, switches 22a, 24a and 26a are also closed, as shown in FIG. 2b, which connects amplifier 20 in the offset memorization mode wherein non-inverting input of amplifier 20 is connected to ground, and the inverting input of amplifier 20 is connected to the output of amplifier 20 and connected through capacitor 25 to ground. In the offset memorization mode, capacitor 25 charges to the offset voltage of amplifier 20. No charging current flows through switch 22a which prevents voltage spiking from occurring across this switch. Voltage spiking across switch 22a, if it were to occur, would be coupled into the non-inverting input of amplifier 20 and cause amplifier instability due to positive feedback. Also, capacitor 25 charges rapidly to the offset voltage of amplifier 20 since resistive feedback is not used in the present invention. The time in which the capacitor is fully charged is limited only by the output drive capability of amplifier 20 and the resistance of switches 24a and 26a. Therefore, elimination of resistive feedback allows much higher commutating frequencies to be achieved in the present invention.

Figure 3A:
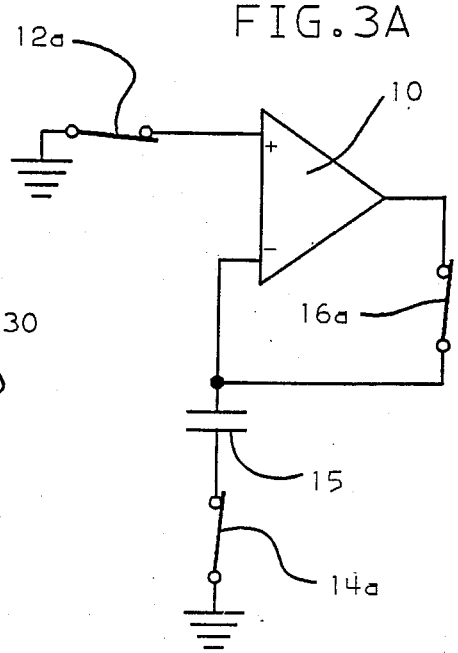
FIGS. 3a and 3b are circuit diagrams illustrating the first and second amplifiers of FIGS. 1a and 1b in the second condition of operation.
Figure 3B:
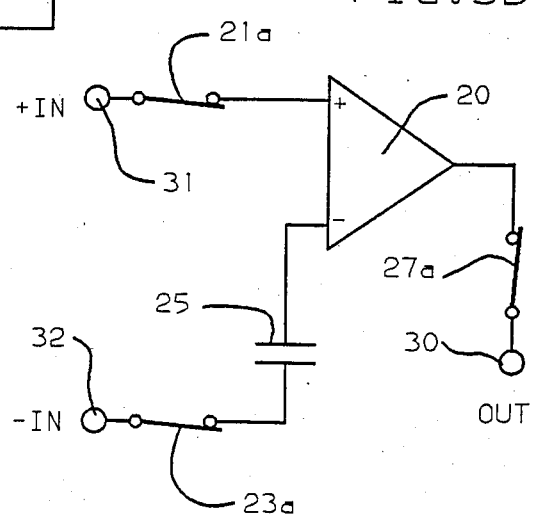

At the end of the first half of the commutating cycle, the switches 11a, 13a, 17a, 22a, 24a and 26a are opened, and the switches of group 2 12a, 14a, 16a, 21a, 23a and 27a are closed so that amplifier 10 is switched to the offset memorization mode, as shown in FIG. 3a, and amplifier 20 is switched to the signal processing mode, as shown in FIG. 3b. Capacitor 25, which was previously charged to the offset voltage of amplifier 20, is switched in series with the inverting input of amplifier 20 such that the voltage stored on capacitor 25 is in the opposite sense or polarity of the offset voltage of amplifier 20. In this configuration, the input signal is coupled to amplifier 20 in series with capacitor 25 and offset voltage cancellation is achieved due to the opposing voltage stored on capacitor 25. During the signal processing mode of amplifier 20, as shown in FIG. 3b, amplifier 10 is in the offset memorization mode, as shown in FIG. 3a, so that during the second half of the commutating cycle, capacitor 15 charges to the offset voltage of amplifier 10. The cycle of alternately opening and closing the switches as described for one commutating cycle is repeated over and over at a rate determined by the commutating frequency. In this manner, the present invention provides a continuous signal path for amplifying low level AC signals while at the same time cancelling the offset voltage and offset voltage drift of the amplifier.

The present invention is particularly adapted to be formed as an integrated circuit or as part of a larger integrated circuit system as shown in FIGS. 1a and 1b. This FIGS. 1a and 1b shows, in-detail, an implementation of the present invention as a CMOS integrated circuit wherein transistors 11, 12, 13, 14, 16, 17, 21, 22, 23, 24, 26 and 27 are n-channel transistors, this means they are conductive if the voltage on their gates are connected to the positive supply voltage, and an open or non-conductive, i.e., if their gates are connected to the negative supply voltage. The offset memorization capacitors 15 and 25 can also be integrated on the same chip. The commutating frequency is brought into the circuit as a clock signal on terminal 33 and is inverted through a clock inverter, consisting of p-channel transistor 90 and an n-channel transistor 91, to provide the compliment of the clock signal. The gate electrode of switches 11, 13, 17, 22, 24 and 26 receive the clock signal at terminal 33 and the gate electrode of switches 12, 14, 16, 21, 23 and 27 receive the compliment of the clock signal from the clock inverter.

Amplifier 10 is formed by a differential input stage consisting of p-channel input transistors 63 and 64, and n-channel load transistors 66 and 67. The inverting input to the amplifier consists of the gate electrode of transistor 63 and the non-inverting input consists of the gate electrode of transistor 64. The DC current in the differential input stage is set by a current mirror consisting of p-channel transistor 61, and the bias string consisting of p-channel transistor 60 and n-channel transistor 65. The output stage consists of a source follower comprised of n-channel transistor 68 and p-channel transistor 62. Capacitor 69 is used for frequency compensation to ensure the amplifier is unconditionally stable. Amplifier 20, as shown in FIGS. 1a and 1b, is identical to amplifier 10. Amplifiers 10 and 20 are connected to a positive power supply at terminals 70 and 74, respectively, and to a negative power supply at terminals 71 and 75, respectively. The positive and negative power supply voltages should be chosen such that they are the same magnitude but opposite polarity, so that the ground reference is exactly halfway between the two voltages. For applications that require only one power supply, the ground reference can be set to a voltage corresponding to exactly one-half of the single power supply voltage.

The circuit illustrated in FIGS. 1a and 1b comprises only one possible manner of implementing the present invention. Alternative arrangements are possible, such as alternative device implementation for the transistors or switches. The commutating frequency may be chosen by the circuit designer and varied for different applications. Typically, the commutating frequency is chosen to be much higher than the highest frequency component of the signal to be amplified. A simple low pass filter can then be used following the commutating amplifier to filter out switching noise. A high commutating frequency also reduces the size of the offset memorization capacitor required, since the capacitor does not have to store the offset voltage for a long period of time.

The invention thus teaches an offset voltage and offset voltage drift correcting amplifier circuit in which the offset voltage error of each amplifier in the circuit is automatically compensated for and corrected and which allows the amplification of low level AC signals while reducing the error introduced by the offset error and the offset voltage drift of the amplifier.

Having now described the present invention it will become apparent to any one skilled in the art that additional modifications and changes to the invention can be made. Accordingly, the invention is to be delineated only by the following claims.

What is claimed is:

1. A circuit for correcting the offset voltage of an operational amplifier having positive and negative inputs and an output comprising:

positive and negative input voltage means for applying a differential voltage to said positive and negative inputs of said operational amplifier, a feedback loop coupling the output of the amplifier to its negative input characterized by a capacitor positioned between the negative input of the amplifier and said negative input voltage means, means for selectively coupling the positive input of the amplifier to ground, and means for selectively coupling the side of said capacitor coupled to the negative input voltage means to ground.

2. The circuit of claim 1 wherein there is further provided first switching means in said feedback loop.

3. The circuit of claim 2 wherein there is further provided respective second and third switching means between said positive and negative inputs and said positive and negative input voltage means, and clock means coupled to said second and third switching means and through a voltage inverter to said first switching means for selectively switching said first, second and third switching means.

4. A circuit having both offset voltage correction and offset voltage drift correction comprising:

first and second operational amplifiers each of said amplifiers having positive and negative inputs and an output, positive and negative input voltage means for applying a differential voltage to said positive and negative inputs of said first and second amplifiers, each amplifier being provided with a feedback loop connecting its output to its negative input, a capacitor positioned between the negative input of each amplifier and said negative input voltage means, means for selectively coupling the positive inputs of said first and second amplifiers to ground, and means for grounding the side of each said capacitor coupled to the negative input voltage means to ground.

5. The circuit of claim 4 wherein there is further provided a first switching means in the feedback loop of said first amplifier and a second switching means in the feedback loop of said second amplifier.

6. The circuit of claim 5 wherein there is further provided respectively third and fourth switching means between said positive and negative inputs of said first amplifier and said positive and negative input voltage means and fifth and sixth switching means between said positive and negative inputs of said second amplifier and said positive and negative input voltage means and clock means coupled to said second, third and fourth switching means and through an inverter circuit to said first, fifth and sixth switching means.

7. The circuit of claim 6 wherein there is further provided a first output switch coupled to the output of said first amplifier and a second output switch coupled to the output of said second amplifier.

8. The circuit of claim 7 wherein said clock means is directly coupled to the first output switch and through said inverter circuit to the second output switch.

9. An amplifier circuit having both offset voltage correction and offset voltage drift correction comprising:

a pair of operational amplifiers, each having differential voltage inputs and each producing an output voltage proportional to the voltage supplied at its voltage inputs, positive voltage input means coupled to a first input of each of said amplifiers through respective first and second transistors and to ground through respective third and fourth transistors, negative voltage input means coupled to a second input of each of said amplifier through respective first and second capacitors and respective fifth and sixth transistors and to ground through respective seventh and eighth transistors, a first feedback loop coupled between the output of the first of said amplifiers and the second input of said first amplifier, a second feedback loop coupled between the output of the second of said amplifier and the second input of said second amplifier.

a ninth transistor in said first feedback loop, a tenth transistor in said second feedback loop, the outputs of said first and second amplifier being coupled through respective first and second output transistors to a common output, each of said transistors being provided with a respective control electrode, and clock means coupled directly to the control electrodes of said first, fourth, fifth, eight, and tenth transistors and to the control electrode of the output transistor of said first amplifier, and through a voltage inverter circuit to the control electrodes of said second, third, sixth, seventh and ninth transistors and to the control electrode of the output transistor of said second amplifier for selectively switching each of said amplifiers between an offset memorization mode for charging the capacitor coupled thereto the offset voltage of the amplifier and a signal processing mode in which the capacitor coupled thereto is placed in series with an input signal to cancel the offset voltage of the amplifier.

10. The circuit of claim 9 wherein said selective switching is performed at a commutating frequency equal to the frequency of the clock signal.

* * * * *